United States Patent [19]
Pasiecznik, Jr.

[11] Patent Number: 5,642,054
[45] Date of Patent: Jun. 24, 1997

[54] ACTIVE CIRCUIT MULTI-PORT MEMBRANE PROBE FOR FULL WAFER TESTING

[75] Inventor: John Pasiecznik, Jr., Malibu, Calif.

[73] Assignee: Hughes Aircraft Company

[21] Appl. No.: 512,736

[22] Filed: Aug. 8, 1995

[51] Int. Cl.$^6$ .................................................. G01R 31/00
[52] U.S. Cl. .................................. 324/754; 324/765
[58] Field of Search ............................ 324/765, 754, 324/755, 758, 72.5, 158.1; 439/482, 824; 437/8

[56] References Cited

U.S. PATENT DOCUMENTS

| | | |
|---|---|---|
| 4,161,692 | 7/1979 | Tarzwell . |
| 4,518,914 | 5/1985 | Okubo et al. . |
| 4,649,339 | 3/1987 | Gangroth et al. . |
| 4,697,143 | 9/1987 | Lockwood et al. . |
| 4,721,198 | 1/1988 | Yajima . |
| 4,733,172 | 3/1988 | Smolley . |
| 4,783,625 | 11/1988 | Harry et al. . |
| 4,786,867 | 11/1988 | Yamatsu . |
| 4,791,363 | 12/1988 | Logan . |
| 4,820,976 | 4/1989 | Brown . |
| 4,849,689 | 7/1989 | Gleason et al. . |
| 4,922,192 | 5/1990 | Gross et al. . |
| 4,928,061 | 5/1990 | Dampier et al. . |
| 4,943,767 | 7/1990 | Yokota . |
| 4,950,982 | 8/1990 | Obikane et al. . |
| 4,972,143 | 11/1990 | Kamensky . |
| 5,012,187 | 4/1991 | Littlebury . |
| 5,027,063 | 6/1991 | Letourneau . |
| 5,034,685 | 7/1991 | Leedy . |
| 5,090,118 | 2/1992 | Kwon et al. . |
| 5,148,103 | 9/1992 | Pasiecznik, Jr. . |
| 5,313,157 | 5/1994 | Pasiecznik, Jr. . |
| 5,455,518 | 10/1995 | Sobhani .................. 324/765 |
| 5,489,852 | 2/1996 | Gomez .................... 324/765 |
| 5,510,721 | 4/1996 | Walles et al. ............. 324/765 |

FOREIGN PATENT DOCUMENTS

| | | |
|---|---|---|
| 0230348 | 7/1987 | European Pat. Off. . |
| 0259163 | 3/1988 | European Pat. Off. . |
| 0294939 | 12/1988 | European Pat. Off. . |
| 0304868 | 3/1989 | European Pat. Off. . |
| 62-169341 | 7/1987 | Japan . |
| 62-263647 | 11/1987 | Japan . |
| WO89/11659 | 11/1989 | WIPO . |

OTHER PUBLICATIONS

Patent Abstracts Of Japan, vol. 12, No. 9 (E–572) 12 Jan. 1988, & JP –A–62169341 (Tokyo Electron) 25.Jul.87, Abstract Only.

1989 Proceedings 39th Electronic Components Conference, May 1989, pp. 71–77, Houston, US; J.A.Fulton et al., "Electrical and Mechanical Properties of a Metal–Filled Polymer Composite for Interconnection and Testing Applications".

*Primary Examiner*—Vinh P. Nguyen
*Attorney, Agent, or Firm*—V.D. Duraiswamy; W.K. Denson-Low

[57] ABSTRACT

A membrane probe (10) for simultaneously testing two or more alternate columns or rows of integrated circuit chips (14) on the processing wafer (12) includes a flexible transparent and self planarizing membrane (22). The membrane includes circuit traces (26) and is carried by a substrate (16) defining parallel ports (18) corresponding to alternate columns or rows of circuit chips (14). Active test circuitry units (48) are mounted on the substrate (16) to perform test functions close to the site of testing. Two probes (10,110) are employed for testing each full wafer. One membrane probe (10) contains ports (18) and membrane segments (22) corresponding to one set of chips on the processing wafer, while the other probe (110) containing ports (18) and membrane segments (22) for the other interlaced set of chips on the wafer. Contact pads (34) are provided on areas of the membrane traces (26) to be visually registered through the membrane with contact pads of the chips under test. A test fixture insert (54) receives either membrane test probe (10, 110) and cooperatively forms a sealed chamber (80) in which pressurized gas urges the contact pads (34) against the contacts pads of the chips (14) for testing. Sufficient space on the surface of the test head (10,110) is provided for mounting active test circuit units (48) on the membrane test heads.

24 Claims, 4 Drawing Sheets

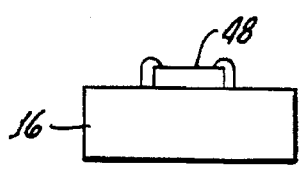
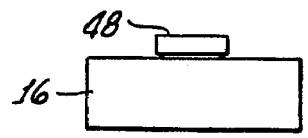
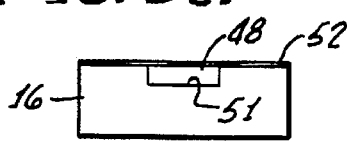
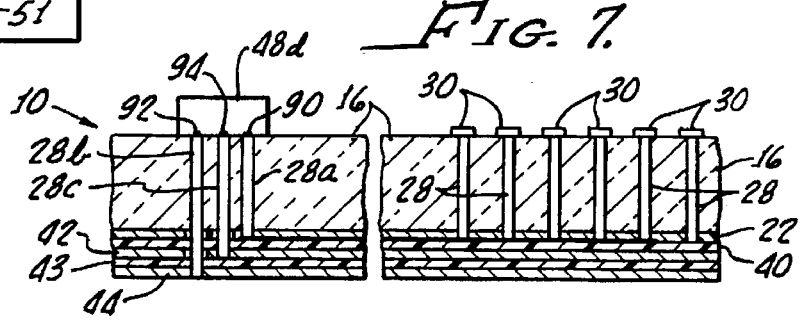
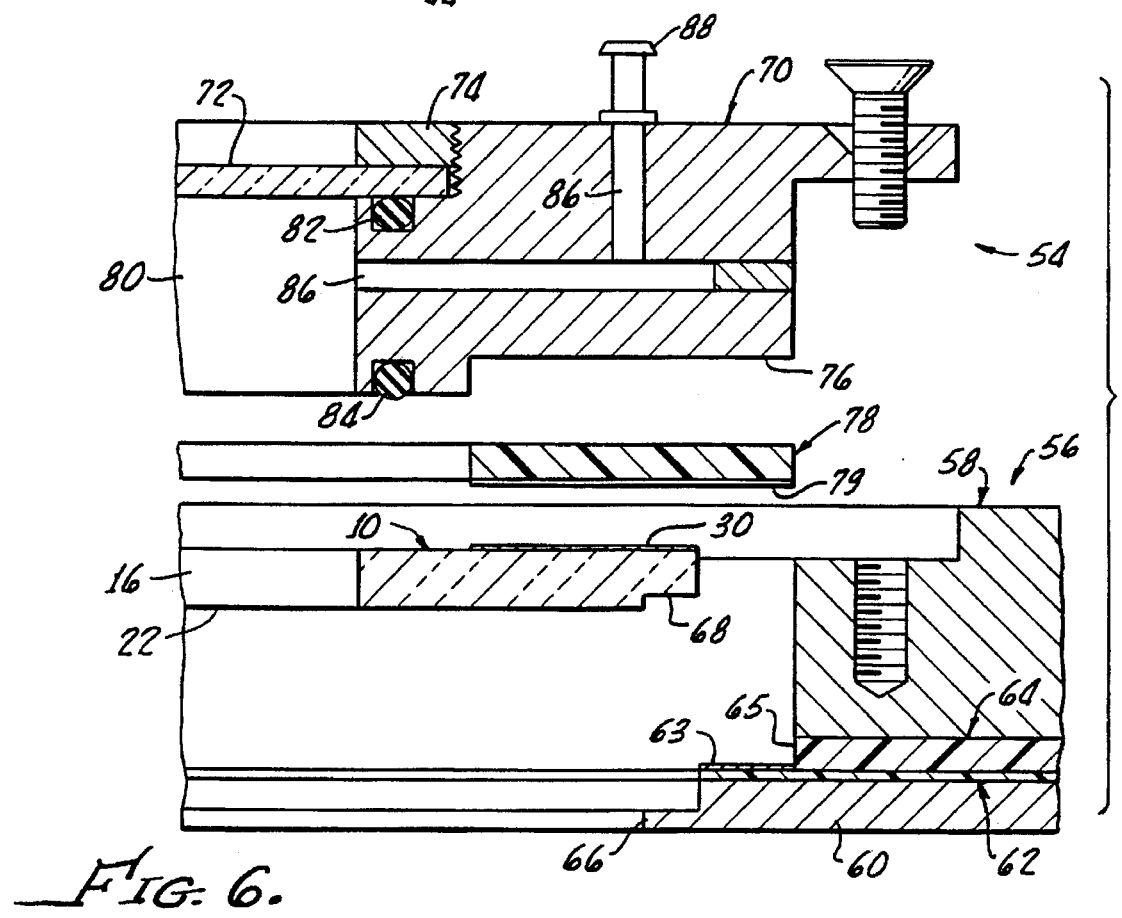

5,642,054

ACTIVE CIRCUIT MULTI-PORT MEMBRANE PROBE FOR FULL WAFER TESTING

CROSS REFERENCE TO RELATED APPLICATION

The present application is technically related to subject matter disclosed in my application Ser. No. 08/323,290, filed Oct. 14, 1994entitled, MULTI-PORT Membrane Probe for Full Wafer Testing (now abandoned).

BACKGROUND OF THE INVENTION

1. Field of the Invention

The present invention relates to testing of integrated circuits, and more particularly concerns improved membrane probes having probe-mounted active testing circuitry.

2. Description of Related Technology

Integrated circuit chips are typically fabricated in batches of large numbers of similar circuit chips on a single processing wafer of semiconductor material and are then individually cut from the wafer for use. The integrated circuit chips are called dice or dies while they are part of the processing wafer. Because of a variety of factors, significant numbers of circuit dies fabricated on each wafer may prove to vary in performance levels or to be inoperable. Therefore, before the dies are separated from the wafer, it is desirable to fully test all dies on the wafer. In this way, a mapping of known good dies may be generated both for efficient sorting of dies into categories of performance and for scrapping the inoperative dies before these dies are packaged. Conventional technology requires dies first to be packaged before a subsequent testing operation can confirm that the package contains a good die. In the event that the die is not good, then the additional cost of packaging the die is also lost when the packaged die is scrapped.

Probe cards presently employed for testing of integrated circuit dies employ a number of probe contact elements, commonly in the form of very small blades or needles. These needles are mechanically and electrically fixed to a circuit board or the like and have leads that fan out to outer edges of the probe card for making connections between the probe card and testing circuitry. The contact blades or needles of the probe card are moved into contact with the contact pads of the die under test, and are electrically connected to external circuitry to apply selected input signals and to read output signals from the die, thus testing the die on the wafer.

In the use of such probe cards, the contact between the probe card blades or needles and the circuit chip contact pads is frequently made by a scrubbing action, which tends to deflect the slender probe elements as much as several mils (i.e., by several thousandths of an inch) on each touchdown. This displacement, which occurs repetitively at least once for each test, further tends to progressively change the desired positioning of the contact elements (i.e., the blades or needles) as the probe card is used. Moreover, such scrubbing action also tends to cause gouging, fretting, or wearing away of the contacting metal surfaces, releasing metallic dust into the testing environment.

The conventional probe card may have from fifty to several hundred contact blades or needles, each of which must be precisely and individually positioned with respect to all others so that upon contact with the die under test, all probe contacts will contact all contact pads of the die. The result is that presently used probe cards are exceedingly expensive, require much maintenance, and are subject to many errors. The factors of contact planarity and alignment (i.e., congruence of the contact needles or blades with the contact pads of the die in plan view) are currently very high maintenance requirements with conventional probe cards.

As integrated circuit operating frequencies increase, so too do the difficulty and extent of the testing problems. Such problems are caused by cross-talk between adjacent signal traces, by signal loss and degradation due to capacitative loading of the circuit under test, and by increased need for shielding and impedance matching of signal lines throughout the test fixture and probe. High frequency probe transmission lines must be properly terminated. Although high frequency connectors can be provided to the probe itself, the physical connection between the probe contacts and the integrated circuit contact pads, which connection conventionally relies upon exposed metallic blades or needles, provides poor high frequency performance and results in extremely fragile components. Thus the final part of the probe transmission line cannot be properly terminated.

In full wafer testing (i.e., testing of all or a significant portion of the dies on a wafer in a single or only a few touch downs of a test probe on the wafer), typical power levels may reach 1000 watts at a typical voltage level of 5 volts, for a current level of 200 amps. Under such conditions, isolation of power distribution and data transmission grids of the test probe from dies that are internally short-circuited is important to prevent drawing down signal and power voltages. Data bussing is used to minimize the number of input and outputs (i.e., I/O) used. Isolating components for such a purpose are most effective when they are positioned very close to the point of physical contact of the test probe with the contact pads of the integrated circuits under test. Thus, probe materials and configurations for the test probe that can support such testing conditions, as well as active power regulators to distribute power to subsets of dies on the wafer, are required.

As the size and spacing distances of integrated circuit dies on a wafer decrease, and the density of contact pads of integrated circuit dies increases (i.e., decrease of size and pitch spacing between contact pads), it becomes ever more difficult to make mechanical blade or needle contacts as small and closely spaced as is required for proper testing of modern integrated circuit chips. Moreover, the great bulk and complex configuration of conventional probe cards do not readily lend themselves to automated handling of the probe cards, or for simplified storage.

My U.S. Pat. No. 5,148,103 describing apparatus for testing integrated circuits has a number of improvements over the conventional probe cards which have a plurality of blades or needles. The new membrane test probe disclosed in may patent includes a flexible membrane and conductive probe contact pads. These are configured in an arrangement for applying pressure to one side of the flexible membrane to accomplish self-planarizing contact of the probe contact pads that is gentle and non-damaging against the contact pads of a die or chip under test. Although considerably more satisfactory than needle probes, this membrane probe has a single large aperture or port, which is not entirely suitable for full wafer burn-in testing, i.e., substantially simultaneous testing of all or substantial numbers of the plural chips on a wafer. In other words, in the design and use of a membrane test probe there are conflicting requirements for thickness of the membrane. The membrane should be as thin and compliant as is possible to facilitate flexibility and drape of the membrane over the contact pads of a die under test. This compliance of the membrane allows the contact pads of the membrane test probe to self-planarize to and make good electrical contact with the contact pads of the die. On the other hand, the membrane should be as thick as is possible in order to allow signal and power distribution grids of the membrane to carry heavy current levels. Of course, such a thick membrane cannot be as compliant as a thin membrane. A thin compliant membrane has no room for power and signal distribution grids sufficiently large in cross sectional area to allow the current levels which would be desired. The thin membrane also has no way of providing for power supply capacitive decoupling. A problem with switching noise inevitably results in such thin membrane structures.

Accordingly, my co-pending application identified above for a multi-port membrane probe for full wafer testing discloses a multiple port configuration for a test probe, providing improved speed of full-wafer testing at high temperatures and efficient mapping of known good dies prior to cutting the dies from the processing wafer. Such a multi-port probe configuration allows testing of alternate rows or columns of dies on a wafer all with a single touch down of the test probe on a processing wafer. Each probe port or aperture, corresponding to a row or column of dies on the wafer, has a comparatively thin and flexible membrane segment stretched tautly across a port of substantially diminished transverse dimension formed in a rigid substrate. This construction greatly reducing the unacceptable membrane sag that is characteristic of prior single-port membrane probes. The membrane itself may be thin and flexible. The portion of the rigid substrate between adjacent ports, which might be thought of as ribs extending between and cooperatively defining the plural ports, can carry power and signal distribution conductors, as well as some passive circuit devices. For example, decoupling capacitors may be placed on the ribs in order to isolate noise created by high frequency switching.

Another feature of such a multi-port probe allows the thermal expansion of the probe material through which the ports are etched to closely match that of the wafer under test, allowing tests to be performed under widely ranging temperatures. Moreover, the relative rigidity of that portion of the probe material that extends between the ports is sufficient to support some passive electrical components. These components (i.e., isolating resistors) can provide improved termination of the high frequency transmission lines and also isolation of power and data grids from shorted dies.

However, with conventional 8 inch semiconductor processing wafers carrying as many as several hundreds of dies, and with as many as 10,000, or more, total contact pads being presented by these hundreds of dies, providing sufficient input-output (I/O) traces on a test probe to conduct full wafer testing of such a processing wafer becomes unfeasible without systems for expanding I/O. For example, problems of data cross talk increase as signal traces are crowded more closely together. Busing, multiplexing and employing of line driver circuits for data distribution are desirable methods for data expansion of I/O. Additionally, because of the ever-higher frequencies utilized by the testing process, the more remote from the wafer are the generation of test vector signal and data storage, the more distortion and signal degradation is suffered as the propagation delay along the length of data transmission lines becomes significant with respect to the signal rise and fall times of the device under test.

For example, since modern test vector signal generation and data I/O can be accomplished at frequencies exceeding 100 megahertz, and into the gigahertz range. However, testing throughput of dies on wafers is severely limited by propagation delay between the test signal generation apparatus and the wafer to be tested. Propagation delay time is approximately one nanosecond per foot. For a typical connecting cable length of five to ten feet, propagation delay on the order of ten nanoseconds appreciably slows the cycle time of the testing process.

Consequently, the speed of the testing process for wafers carrying many integrated circuit dies would be desirably increased if the signal generation and data accumulation were performed closer to the test site, i.e., nearer the dies. Ideally, the multiplexing, line driving, test vector signal generation, and data storage functions would be performed by systems on board the test probe itself. Neither the 5,148,103 patent nor any other known arrangement provides for such on-board operation of these active systems nor for a number of other improvements that are available with the methods and apparatus described herein.

Accordingly, it is an object of the present invention to provide for multi-chip testing of integrated circuit chips while avoiding or minimizing the problems mentioned above.

SUMMARY OF THE INVENTION

In carrying out principles of the present invention in accordance with an exemplary embodiment thereof, two groupings of columns or rows of integrated circuit chips formed on a processing wafer are each contacted serially by providing a test probe set. An exemplary test probe set consists of two test heads, each of which is configured to test all chips in a respective one of the two groupings, and each test head has at least one active test circuitry unit mounted on board the test head. The active test circuitry units are themselves integrated circuit chips for performing test functions very close to the site of contact of the test head with an integrated circuit die to be tested. Typical active test units include, for example, microprocessors for test vector generation, memory chips for data storage, one part of a multiplexer-demultiplexer set for data compression and expansion, voltage regulators, and one part of line driver-line receiver sets, or any combination thereof.

According to another feature of the invention, a test head of a probe set consists of a substrate having elongated mutually spaced ports corresponding (i.e., congruent in plan view) to alternate columns or rows of dies on a processing wafer to be tested, a flexible transparent membrane having a pattern of electrical contact pads and electrically conductive traces connecting to the contact pads formed on the membrane, and sufficient surface area of the substrate surrounding the ports to allow mounting of active test circuitry units on the substrate.

A plurality of contact pads are formed on the membrane traces, the contact pads being visually accessible through the substrate ports. Connector pads on the periphery of the substrate are connected to the traces through the active test circuitry units to facilitate electrical connection to a test fixture via the test head.

According to other features of the invention, a test fixture is configured to receive a test head incorporated into a test fixture insert so that the insert together with the test head forms a gas pressure chamber for urging the contact pads of a test head membrane toward the corresponding contact pads of an integrated circuit die on a processing wafer to be tested. An elastomeric ring with conductors thereon provides electrical connection between test head connectors and a printed circuit board in the test fixture. The arrangement of the test fixture, insert and test head is structured to provide ample space on the test head for mounting of the active test circuitry units.

BRIEF DESCRIPTION OF THE DRAWINGS

In the accompanying drawings:

FIGS. 5a–5c are schematic sectional views of a typical on-board active test circuitry unit illustrating methods of mounting an active test circuitry unit to a test head.

FIG. 6 is a fragmentary exploded sectional view of a portion of a test fixture and test head illustrating the interface detail between them.

FIG. 7 is a fragmentary sectional view of an on-board active test circuitry unit illustrating an arrangement for mechanical connection of its input and output terminals.

DETAILED DESCRIPTION OF AN EXEMPLARY EMBODIMENT

Figure 1:
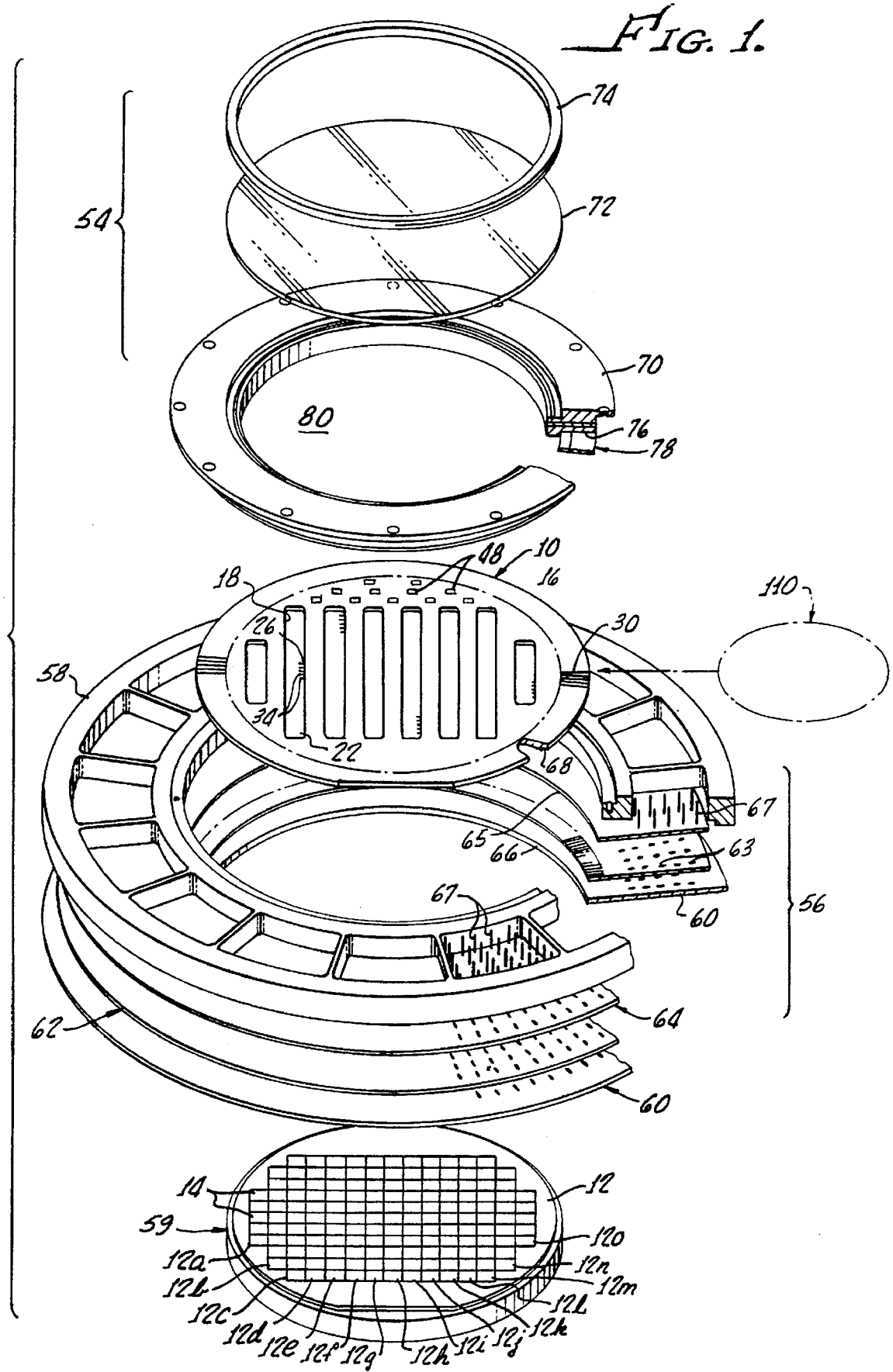
FIG. 1 is an exploded perspective view of a test fixture and one membrane probe test head of a pair of test heads embodying principles of the present invention.

FIG. 1 illustrates a membrane probe test head 10 and test fixture 56 embodying principles of the present invention. Advantageously, the present testing apparatus employs a complimentary set of membrane probe test heads, each in a multi-port configuration that overcomes the characteristic problem of membrane sag or drape of a conventional membrane probe having a single aperture. Also, with a membrane probe test head according to the present invention, the membrane itself may be thin and conformal, while high current levels for power distribution and signals are provided by routing conductors for these purposes along the ribs of substrate material between apertures which define the ports. With a multi-port arrangement of the membrane probe test heads, an entire column, or a group of alternate columns, of integrated circuit chips on the wafer may be contacted and tested during one touchdown of a membrane probe test head (such as the test head 10 shown in FIG. 1), on a processing wafer.

A significant feature of the present invention is the feasibility of mounting self-contained active test circuitry units on board the membrane probe test heads themselves. Circuitry performing the functions of these on-board active test circuits were formerly located remotely from the points of electrical contact between the conventional test cards or test heads and the dies of a wafer under test. Under typical conventional testing conditions with frequencies starting as low as the hundreds of megahertz and extending into the gigahertz range, the distances between the remote circuits and the dies tended to cause problems of delay of test signals because of propagation delay, signal degradation and power loss. It is now practical employing the principles of the present invention to place on board the membrane probe test heads such active test circuitry units as microprocessors for test vector control, memory circuit chips for data storage, multiplexer-demultiplexer sets (MUX/DEMUX) for data expansion of input-output (I/O) leads, voltage regulators for power distribution and line driver-receiver sets for data distribution.

On-board microprocessors minimize the limitations on throughput caused by propagation delays, which were on the order of one nanosecond per foot from the conventionally remote central processing unit (CPU) to the test sites, while on-board memory chips with capacities in the megabyte range allow for efficient interrogation of locally-stored data by the master computer. MUX/DEMUX functions can be accomplished by addressing the number of data lines coming in to the membrane probe test head, switching the lines to a number of different ports via control pins to do steering for test signals and for test results. Alternatively, a time division method to serialize (multiplex) a data stream and sends it to a demultiplexer to convert to parallel streams leading to membrane probe contact pads may be used.

Voltage regulators and line driver/receiver units serve to control power and boost signal strengths, respectively, at the end of transmission lines from a remote source (i.e., at the areas of the ribs adjacent to the portion of a membrane where such signals and power are to be applied to a die under test). The more rigid nature of the central region and ribs of a membrane probe test head, which central region surrounds and separates the membrane probe ports, also allows mounting of passive circuit components (such as high current power planes, decoupling capacitors and load isolating resistors), within that supportive membrane probe central region. That is, line drivers drive data columns, and buffers at each rib of the membrane probe test head drive signal busses extending along these ribs to locations for testing individual die by groups of electrical contacts on an adjacent membrane portion in patterns congruent and matching to contacts on die to be tested. Thus, in the event that any one die (or a number of die under test in a particular group of die) is shorted, these circuit elements will limit the current levels to the shorted die while other die in the group still receive adequate current and signal levels for testing. That is, shorted die in a group of die under test do not pull down the power or signal level delivered to other die of the group, and these other die are subjected to a valid testing.

The present invention features an improved test fixture and membrane probe test head layout configuration that provides the considerably greater available on-board area required for the placement on the membrane probe test heads of the active test circuitry units just delineated, along with necessary passive circuit elements as well. Additionally, with the large surface area of the power planes of the present membrane probe test heads, and the intervening dielectric provided by layers of the membrane itself, this provides both a low inductance between power and signal planes, and a distributed capacitance between these power planes and signal conductors and ground.

A typical processing wafer 12 of about six to eight inches in diameter, for example, is formed with as many as several hundred individual dies 14, each of which has a width of up to about 500 mils (i.e., one-half inch), and all positioned usually (but not necessarily) in a regular rectangular array of columns and/or rows of dies each spaced from adjacent die in adjacent columns and/or rows of dies on the wafer. Those ordinarily skilled in the pertinent arts will recognize that the geometric arrangement of the die may include both regular columns and rows, or only regular columns or only regular rows. In mass production, it is desirable to test these dies 14 on the wafer 12 in as short a time as possible. Therefore it is desirable to test of all dies 14 in a group of dies on the wafer 12 with a single touch down of a test probe head on the wafer. For purposes of describing the present invention, the dies 14 will be divided into two groups, each group being tested with a single touch down of a corresponding membrane test probe head.

For purposes of this minimizing of the number of touch downs by a test probe necessary to test all of the die 14 of the wafer 12, the dies on a wafer are divided (conceptually and operationally, but not physically) into two groups and a membrane probe test head set including two membrane probe test heads (i.e., the set includes two complimentary membrane probe test heads). The first group of die is composed of alternate columns of dies, such as, for example the odd numbered columns illustrated in FIG. 1 as 12a, 12c, 12e, 12g, 12i, 12k, 12m, and 12o, and the second group is composed of the remaining dies, namely the even numbered columns (12b, 12d, 12f etc.) which are interdigitate between the odd numbered columns. A membrane probe pair includes a first membrane probe test head 10 uniquely configured for testing of all dies of the first group of dies in a single touch down of the test head on the wafer 12, and a second test head 110 (schematically depicted in FIG. 1) uniquely (and differently than head 10) configured for testing of all dies of the second group of dies also in a single touch down on the wafer. As I have previously explained in application identified above, in such two-probe sets membrane probes, one membrane probe will have ports congruent with one group of dies on the wafer 12, and the other probe will have ports aligned congruently with the remaining die on the wafer 12. The membrane probe pair 10,110 thus completely tests all chips 14 on a full wafer 12 with only two touchdowns of a membrane probe, one touch down for each test head 10, 110 of the membrane probe pair.

Those ordinarily skilled will also recognize that the invention may be practiced with multi-port probe sets having more than two membrane probe test heads. The sets of test heads may include three probes (for testing all die of a wafer in three touch downs), four probes (requiring four touch downs to test all the die of a wafer, or any number of test probes which is convenient. The two probe sets of membrane test probes are preferred because only a single touch down would be effected at each of two test stations, each test station effecting one of the touch downs necessary to test all of the die on a wafer. In this way a great time saving is realized over the conventional testing methods using many touchdowns because the time required for all of the repetitive step-and-repeat touch downs of conventional testing is avoided. That is, conventional test cards are touched down once for each die of a wafer, requiring considerable time for the testing station to physically execute all of these step-and-repeat motions. The present invention relies on a minimum of two touch downs and substitutes electrical switching at rapid rates for physical movements in order to test all of the die serially, or in groups (possibly in sub-groups smaller than half of the die on a wafer) in which all of the die of a group or sub-group are tested simultaneously.

An exemplary membrane probe test head configured for testing all dies in only two touch downs on a processing wafer is illustrated in FIGS. 1 through 4 for purposes of explaining the present invention. For simplicity of explanation, the remainder of the discussion will address only membrane probe test head 10, it being understood that the discussion applies as well to corresponding features of complementary test head 110 and its associated substrate 116, since the two test heads are mechanically similar with differences (to be described below) primarily in the location and configuration of their elongated ports and circuitry.

Figure 4:
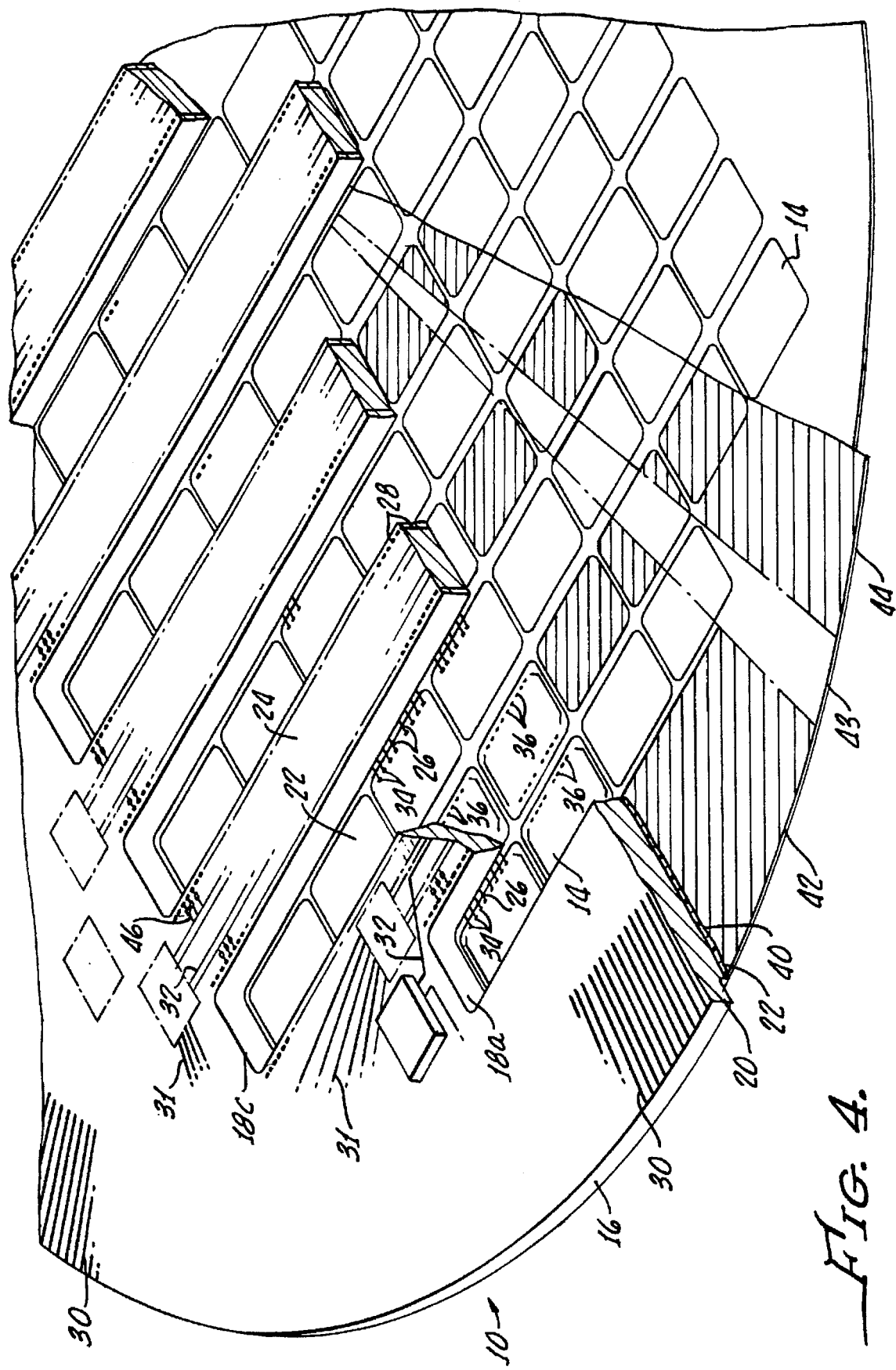
FIG. 4 is an enlarged perspective view, partly in cross section with parts of the structure broken away and removed for clarity of illustration and showing part of the probe test head of FIG. 2.

As illustrated in FIG. 4, membrane probe test head 10 is formed of an electrically non-conductive rigid or semi-rigid and self supporting substrate 16 in the configuration of a generally flat, thin disc having multiple elongated ports 18 extending completely through the substrate. The substrate 16 is clad on both sides with thin layers of a transparent flexible dielectric such as polyimide layers 20 and 22. Ports on first test head 10 are numbered 18a, 18c, 18e, 18g, etc. to better portray the alternate column configuration of the test head. These ports are in correspondence with the odd-numbered columns of dies 14 on the processing wafer 12. The outer polyimide layer 22 extends across each port 18. However, the inner polyimide layer 20 does not extend across the ports 18, being of a configuration congruent with substrate 16 and having apertures (not numbered on the drawings) coextensive with the elongated ports 18 of substrate 16 as illustrated in FIG. 4. Thus each port 18 is closed on one (outer) side of the substrate 16 by a polyimide layer 22, but is open on the other (inner) side of the substrate 16 to admit air pressure, as will be described below.

The straight portions of substrate 16 between and immediately adjacent to ports 18 are designated as rib portions 24 and include those substrate portions separating adjacent ports from one another. These rib portions 24 serve several important functions to be described below. A pattern of electrically conductive contact traces 26 is formed on one (outer) side of the substrate, upon polyimide layer 22. The contact traces 26 extend from contact pads 34 disposed in a selected pattern upon the membrane 22 within the boundaries of each substrate port 18. The traces 26 run generally perpendicular to substrate rib portions 24 and extend to a plurality of metallized vias (i.e., electrically conductive conduits) 28 that extend through the substrate 16 and polyimide layers 20,22 on each side. The particular structure and steps of making the traces 26 and contact pads 34 will be further described in detail below.

Figure 2:
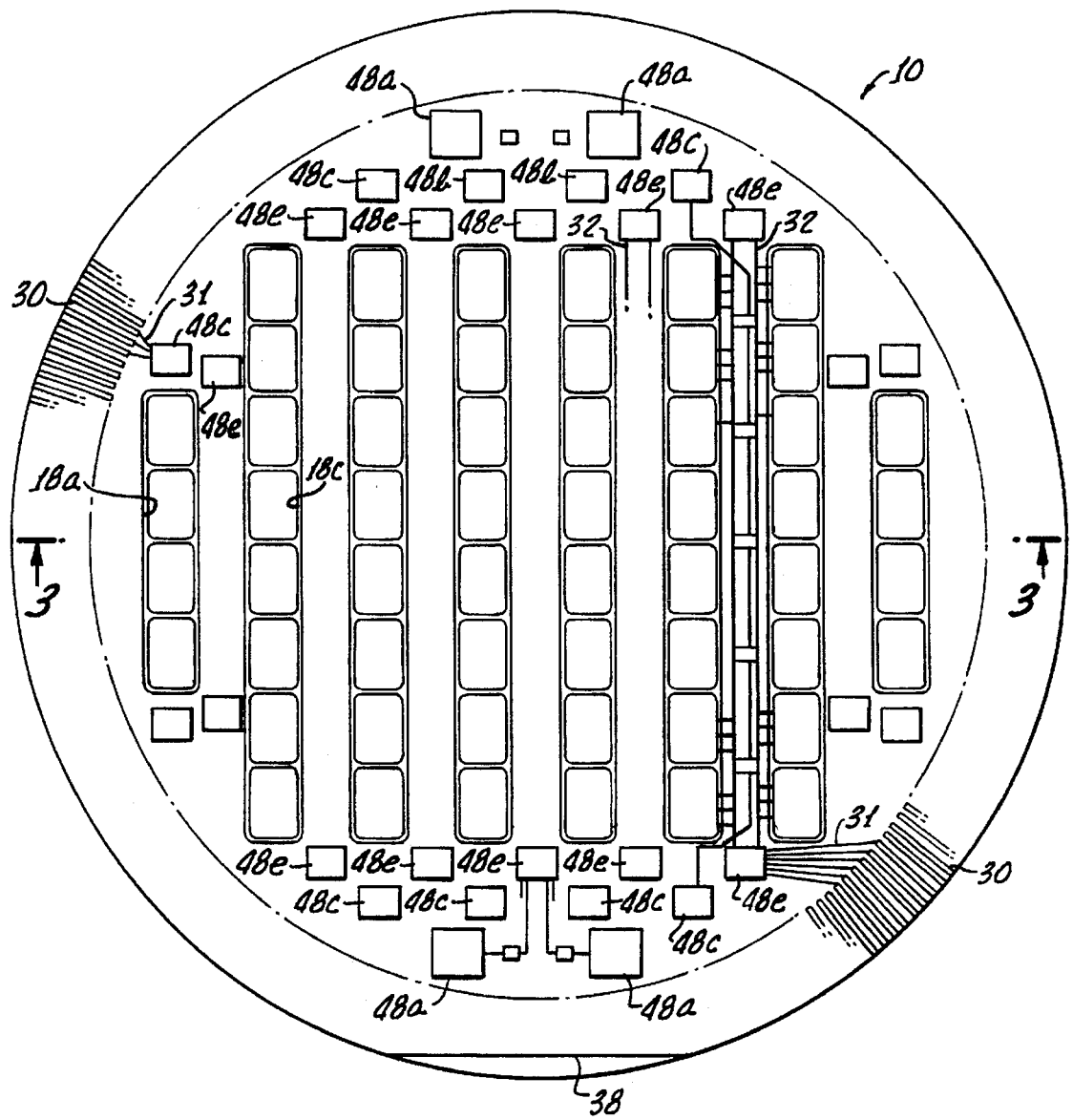
FIG. 2 is a plan view of a membrane probe test head illustrating an arrangement of on-board active test circuitry units.

The inner side of the membrane probe test head 10, which bears the polyimide layer 20, carries on the periphery of the test head a plurality of relatively short, radially extending electrically conductive connector pads 30 individually connected to respective leads 31 as more clearly seen in FIG. 2. These leads 31 are for data input-output, power, and ground connections and feed into the various active test circuitry units 48.

Viewing FIG. 4, the outputs from each of the active test circuitry units 48 are then fed into other such units or directly into signal traces 32. Each of these signal traces 32 may be connected to one or more of the contact traces 26 by means of the appropriately located metallized substrate vias 28. Alternatively, connector pads 30 may be formed directly on the substrate 16, omitting layer 20. The end of each contact trace 26 opposite its via 28 bears an axially projecting (i.e., perpendicularly to the plane of the substrate 16) contact pad, such as pads 34, which are arranged in a configuration that will match the electrical contact pads 36 of a circuit die 14 to be tested. Thus the contact pads 34 are positioned on an unsupported area of the membrane 22 within each port 18. In use of the membrane probe test head 10, with the outer layer 22 facing downwardly, the contact pads 34 are the lowest points of the membrane probe, so that only these pads will contact the electrical contact pads 36 of chips 14 to be tested, particularly after the pads 34 are displaced outwardly by air pressure applied at each port 18 in order to bend the flexible membrane 22 outwardly.

Substrate 16 is formed preferably of a thin rigid photoform material having a flat edge section 38 (FIG. 2) formed on one side thereof to facilitate alignment in a test fixture and registration of the membrane probe contact pads 34 with the wafer die pads 36 as shown in FIG. 4, and as will be described below.

In manufacture of the described membrane probe test heads 10, 110, the photoform substrate 16, in the form of a solid, substantially rigid and self-supporting disc, is provided with a number of preformed holes to be used to define the vias 28. Preferably the photoform disc may have a diameter larger than the diameter of a standard wafer and may be either six inches or eight inches in diameter, for example, having a thickness of about 90 to 125 mils. A thinner substrate would provide less support for the membrane segments 22 stretched across each port 18, while a thicker substrate would impede efficient filling of the vias 28 with conductive material as described below. In order to provide the conductive vias 28, the holes through the substrate photoform material are first filled with a conductive material. Preferably, this conductive material may be a conductive silver/glass frit. Next, the vias are capped and prepared for electrical interconnection with the traces by providing first a thin wetting and protective layer (of about 500 Angstroms thickness) of tungsten with a small amount of titanium, W(Ti) over the face of the substrate. Next, a comparatively thicker (of about 5 microns thickness) and more robust layer of copper is applied. Finally, to protect the copper from oxidation, and to improve the ability to pattern and define the shape of the copper layer, a capping layer of about 250 Angstroms of W(Ti) alloy is applied over the copper layer. This metal layer of W(Ti)/Cu/W(Ti) over the photoform substrate is patterned to leave caps or buttons of this metallic sandwich structure congruently over the openings of the filled holes in the substrate, so that these metallic buttons are electrically connected with the conductive material in the vias.

Next, a layer of the membrane 20 or 22 is applied to each side of the photoform substrate by employing standard spinning techniques in which a small amount of polyimide is placed on the photoform surface and the disc is spun to centrifugally distribute the polyimide evenly and radially outwardly. One or more repetitions of this application and spinning process will be used to provide a layer of polyimide of about 5 microns thickness covering the faces of the substrate and the buttons of conductive metallic sandwich structure at the vias. This first layer of polyimide material is then photolithographically patterned and partially removed to provide openings congruent with selected ones of the vias, exposing the corresponding ones of the metallic buttons described above. Alternatively, conventional curtain coating can also be used to apply the polyimide to larger sizes of substrates.

Again, the faces of the substrate (prepared as described) above has a metallic sandwich structure of W(Ti)/Cu/W(Ti) applied, in the thicknesses and as described above. This first metallic sandwich layer will serve as one of the power or ground or signal planes of the finished membrane probe test head 10, and electrically contacts the exposed metallic buttons and conductive vias, as described above. This sandwich layer is patterned and selectively removed to configure the particular one of the ground, signal, or power plane to be defined as desired.

Next, a dielectric layer is formed atop the first W(Ti)/Cu/W(Ti) metallic layer. This forms the dielectric passivation layer 40 (FIGS. 3 and 4) which may be of a polyimide, to effectively electrically insulate the surface of the conductive traces 26. As described above, polyimide material is applied and spun to build up the desired thickness of material. Several repetitions of this spinning process will build up the membrane thickness to provide the finished polyimide membranes 20, 22 with dielectric layers each of about 1 mil in thickness on each side of the photoform substrate. The polyimide is highly transparent to enable visual registration of the membrane probe contact pads 34 with appropriate contact pads 36 on the dies being tested. Although the polyimide film may be applied in various ways, the spinning process is preferred because it yields a film that, although axially flexible within ports 18, is laterally taut across the relatively narrow transverse span of a port 18 so that the film is dimensionally stable in the plane of the film but may be flexed outwardly by gas pressure, as will be described below. As mentioned above, for larger sizes of substrates the conventional curtain coating process may be used as an alternative to spinning. For the larger sizes of substrates, the curtain coating method may be preferred because of the saving in polyimide material. This dielectric layer may be patterned and partially removed as necessary to expose additional ones of the metallic capping buttons conductively disposed in association with selected ones of the vias through the substrate.

Again a metallic sandwich layer of W(Ti)/Cu/W(Ti) is applied, in the thicknesses and as described above. This next-subsequent metallic sandwich layer will form another of the power, ground or signal planes necessary for the membrane probe test head 10. Another dielectric layer and another metallic sandwich layer may be applied as described above, with patterning and partial removal of the intervening layers to expose selected ones of the conductive capping buttons at selected vias so that the remaining one of the power, ground, and signal planes of the membrane probe test head 10 is formed. Those ordinarily skilled in the pertinent arts will recognize that the conductive traces 26 may be formed as appropriate as part of the metallic sandwich layers of W(Ti)/Cu/W(Ti) material as described above by patterning and partially removing these layers to leave extending conductive traces 26 which are electrically continuous with the particular ground, power, or signal layer as desired.

After application of the multi-layer metallic/polyimide film structure to both sides of the substrate as described above, the contact pads 34 are formed on one side of the substrate, on membrane 22. The connector pads 30 are then formed on the other side and the ports 18 are formed in the photoform and also in the inner polyimide layer 20 but not in outer layer 22. Now, using photolithography, masking and applying resist, the contact pads 34 are plated up (to a height of 1 mil above traces 26, for example) on the ends of contact traces 26. Alternatively, the contact pads 34 may also be shaped to a selected or desired shape, such as to a circular, rectangular, pyramidal, conical, or truncated shape. If deemed necessary or desirable the contact pads 34 finally may be flash coated with a highly stable conductive material such as a cobalt-gold flash coating.

Figure 3:
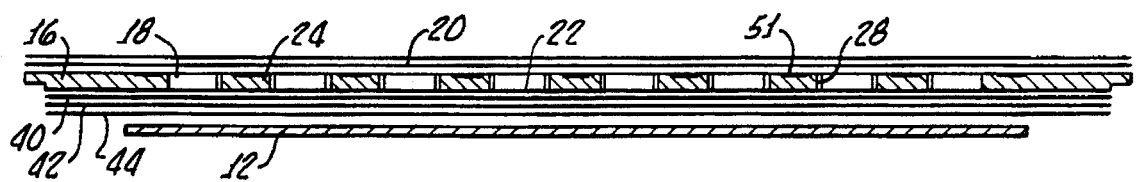
FIG. 3 is a cross section view taken in line 3—3 of FIG. 2.

Similarly, photolithography, employing suitable application of resist, development of the resist and removal of the undeveloped resist, is then employed to first sputter a thin metal coating on inner layer 20 in the desired pattern of connector pads 30 which then may be copper plated to provide a plurality of connector pads (about 1 mil high) that extend in closely spaced relation circumferentially around the periphery of the inner side of the membrane probe test head 10 or 110, as can be best seen in FIG. 2. These pads 30 are connected to corresponding leads 31 that may connect through traces 32 to a metallized via 28 so that at least some peripheral connector pads may be electrically connected by way of such vias directly to associated ones of the contact traces 26. As is described above, the power and ground planes may be formed on layers adjacent to outer membrane 22 and passivation layer 40 as shown in FIGS. 3 and 4. These power and ground planes with associated traces are disposed in a power plane 42 and ground plane 44, respectively, and may then be connected through voltage regulator active circuitry units 48d to connector pads 30 in the manner described above. The power and ground planes are preferably separated by a dielectric layer 43 as shown in FIG. 4. The structure of the power plane 42 and ground plane 44 with intervening dielectric layer 43 provides a large distributed capacitance. This provides a low-inductance power delivery structure.

Passive electrical elements, such as thin film resistors 46 for isolating power or data busses from a wafer chip 14 that is internally short circuited, may also be mounted on the membrane probe 10 and supported by the ribs 24 of substrate 16 as illustrated in FIGS. 2 and 4.

After forming the conductive traces 26, 31, 32 on both sides of the membrane probe by suitable masking and application of resist, the several elongated ports 18 are etched through the central region of substrate 16 (and through layer 20), resulting in the membrane probe configuration illustrated in FIGS. 2 and 4. This material removed from the substrate 16 to form the ports 18 is in the "opal" condition, having been pre-exposed during formation of the substrate 16. These figures show exemplary locations for the active test circuitry units 48 discussed above, viz., microprocessor units 48a, memory chips 48b, MUX/DEMUX chips 48c and line driver/receivers 48e. Voltage regulators 48d will now be discussed separately.

Voltage regulator chip 48d is a three-terminal active circuitry unit mounted on the upper surface of membrane probe test head 10 as illustrated in FIG. 7. Regulator 48d is connected by vias 28(a–c) extending through substrate 16 to power input, power output and common ground leads on the lower surface of the membrane probe test head 10. FIG. 7 illustrates an arrangement wherein vias 28 from five peripheral connector pads 30 are bussed together below the substrate 16 to convey power input from the upper surface of membrane probe test head 10 to a via 28a and thence up through the substrate 16 to the power input terminal 90 of a voltage regulator unit 48d. Common ground may be connected to another grouping (not shown) of connector pads 30 to ground plane 44 and in a similar manner up to terminal 92 on voltage regulator 48d by via 28b. Regulated power output is then delivered from voltage regulator 48d power output terminal 94 through another via 28c down through substrate 16 to the power plane 42 adjacent to the lower surface of membrane probe test head 10. When such voltage regulator units 48d are employed, they may occupy the positions shown by the locations of the line driver/receiver units 48e illustrated in FIG. 2 at the upper ends of ribs 24.

Active test circuitry units 48(a–d) are mounted in their respective locations by one of several methods as illustrated in FIGS. 5a through 5c. FIG. 5a shows a wire bond arrangement in which an active circuit unit 48 is mounted with its electrical contact pads upward, and wires 50 connect the contact pads to terminals on the substrate 16. FIG. 5b shows an active circuit unit 48 in an upside down (flip-chip) arrangement, with its electrical contact pads contacting substrate terminals via well known intervening re-flowed solder-ball contacts. FIG. 5c shows an active circuit unit 48 embedded in a substrate well 51, with contacts contained in a dielectric Tape Automated Bonding overlay 52 (i.e., TAB mounted).

The result is a thin, relatively rigid, self-supporting membrane probe test head 10 or 110 having a flat edge 38 for orientation and registration in a test fixture, active test circuitry units 48 for performing test operations advantageously proximate to the points of contact with a wafer under test, and thin, flexible, taut, transparent port membranes 22 to the outer side of which are affixed projecting membrane probe contact pads 34 in a selected pattern that matches the pattern of pads 36 on a grouping of columns of dies to be tested.

Other numbers and configurations of ports 18 may be used as deemed necessary or desirable. The configuration of the ports 18 and their grouping is specifically chosen to match the configuration of a column of dies and the configuration of a group of alternate columns in the illustrated arrangement. For example, if the aspect ratio of the dies on the wafer is such that the width of a die 14 is substantially less than its length, the distance between columns (i.e., vertical arrangement of FIGS. 2 and 4) is relatively narrower than the distance between rows (i.e., horizontal arrangement) of the same dies. Consequently, an arrangement of ports 18 spaced on alternate columns of dies will result in a rib 24 with a width narrower than would result from an arrangement of ports 18 spaced on alternate rows. Accordingly, membrane probe 10 may be configured to space ports 18 on alternate rows rather than alternate columns to provide desirably wider ribs 24 under the described conditions. For simplicity in explanation, reference herein is made generally to columns of dies, but it will be understood that the description applies equally to rows of dies.

Alternatively, if neither the length nor the width of the dies 14 is sufficient to allow for a desirably wide rib 24 merely by changing port 18 orientation from columns to rows of dies as just described, the ports 18, congruent membrane portions 22 and associated traces 26 may be configured so that contact pads 34 contact two or more adjacent columns of dies 14. In this way, as long as membrane portions 22 are maintained narrow enough to remain tautly stretched across ports 18, ribs 24 are accordingly relatively wider to the extent that they span more than one column of narrow dies 14, resulting in more rigidity and thus better support for circuit elements, units and traces.

The described membrane probe 10 may be used with many different types of testers and test fixtures. It is preferably used with application of a suitable pressure, such as a gas pressure, against the inner surfaces of the flexible transparent membrane 22 within elongated ports 18. However, the membrane probe illustrated in FIG. 1 is specifically designed for use in a test fixture to which the membrane probe may be readily mechanically and electrically connected and disconnected. In the exemplary membrane probe configuration, both electrical and mechanical connection of the membrane probe to a test fixture are accomplished by incorporation of the membrane probe into a test fixture insert and installing the insert into a test fixture housing. The inner surface of the membrane probe test head 10 includes the connector pads 30 that form a substantially circular array around the periphery of the inner side of the test head. Membrane probe test head 10 is configured and arranged to enable mechanical attachment of the membrane probe to a test fixture insert 54 of a test fixture assembly 56 (viewing FIGS. 1 and 6).

Illustrated in FIG. 1 is a test fixture assembly, generally indicated at 56, fixedly mounted above a movable work table 59 on which is placed a processing wafer 12 bearing dies 14 that are to be tested by a membrane probe test head 10. The latter may be of the configuration illustrated in FIGS. 2 and 4. The work table is movable in X,Y and Z, that is, in two perpendicular directions horizontally, and in one direction vertically by suitable manually or automatically controllable means (not shown).

As can be seen in FIGS. 1 and 6, a rigid retaining plate 60 supporting a printed circuit board 62 and a dielectric spacer 64 has a central aperture defined by a radially inwardly directed lip 66. The lip 66 supports a circumferentially and radially outwardly extending flange 68 of substrate 16 of test head 10 (viewing FIG. 6). Retaining plate 60 is secured to test fixture housing 58 with printed circuit board 62 and spacer 64 sandwiched between them to complete test fixture assembly 56.

Mechanically attached to test fixture assembly 56 is test fixture insert assembly 54, consisting of insert housing 70 and window 72 fixed to the insert housing by window retaining ring 74. Fitted into an annular recess 76 in the lower periphery of insert housing 70 is an annular metal-on-elastomer electrical connection bridge known as a MOE 78, as more clearly seen in FIG. 6.

When test head 10 is brought into firm contact with insert housing 70, a gas pressure chamber 80 is defined by substrate 16 and window 72 at its lower and upper boundaries respectively, and by the interior circumference of insert housing 70 as its circumferential wall. An O-ring gasket 82 in insert housing 70 forms a seal between the housing and window 72. Similarly, O-ring gasket 84 seals the contact between the housing 70 and membrane probe test head 10. Pressure chamber 80 is thus enclosed at the bottom by the upper surface and membrane segments of membrane probe test head 10.

A gas conduit 86, initially extending horizontally in fabrication through the insert housing 70, connects to the interior of pressure chamber 80. A vertical portion of conduit 86 is formed to connect with the horizontal portion thereof, after which that segment of the horizontal portion which extends to the outside of insert housing 70 is plugged, so that conduit 86 connects only chamber 80 with a fitting 88 at the upper end of the conduit 86 vertical portion. Fitting 88 connects conduit 86 to a source (not shown), but represented on FIG. 6 by arrow 88 of pressurized gas, such as air, which will apply a pressure to chamber 80 on the order of two to four pounds per square inch, thereby causing flexible membrane segments 22 to flex outwardly within each elongated port 18.

For electrical connection of the membrane probe test head 10 to remote test circuitry, a multilevel printed circuit board 62 as shown in FIGS. 1 and 6 is fixedly secured between the test fixture retaining plate 60 and the dielectric spacer 64 which receives test circuit connectors 67 (FIG. 1). Leads 63 on the printed circuit board 62 are connected to the elastomeric electrical connector in the form of the annular metal-on-elastomer ring 78 (MOE) noted previously. The MOE comprises a suitable elastomer, such as a silicon rubber sponge, that has a plurality of circumferentially spaced apart and closely positioned, individual narrow metal connector elements 79 positioned thereon as shown in FIG. 6. The connector elements 79 of the MOE 78 and the connector pads 30 of the membrane probe test head 10 are positioned to mate with one another when the membrane probe test head 10 is secured, with installation of test fixture insert assembly 54 into test fixture housing 58 as shown in FIG. 6.

The leads 63 on the upper surface of printed circuit board 62 are exposed by the larger inner diameter 65 of dielectric spacer 64. This inner diameter 65 forms a recess that receives the MOE 78 as best seen in FIG. 6. The electrically conductive connector elements 79 of MOE 78 on its lower surface form a bridge to connect the connector pads 30 of the membrane probe 10 with the leads 63 of the multi-level printed circuit board 62.

When test fixture assembly 56 is assembled, the signal and ground leads 63 of the circuit board 62 are connected to circuit connector pins 67 on dielectric spacer 64, as shown in FIG. 1. Circuit connector pins 67 project from dielectric spacer 64 into test fixture housing 58. Connector pins 67 serve to transmit signal and power to and from remote master controlling circuitry (not shown) which performs those control functions that are not implemented by the test membrane probe on-board active test circuitry units 48. Typically, the test fixture assembly 56 will have 600 pins 67 for a ten inch substrate to test die on an eight inch processing wafer, or 480 and 360 pins 67 for eight inch and six inch substrate, respectively for testing die on six inch and four inch processing wafers.

After the test membrane probe 10 has been positioned in contact with the elastomeric membrane probe connector (MOE), the test processing wafer containing dies 14 is moved upwardly to or toward a very light contact with the test head contact pads 34 as shown in FIG. 4. Now a human operator or machine vision system visually observes the die pads 36, which are readily visible through the membrane probe ports 18 and the transparent membrane 22 upon which the contact pads 34 are mounted. While the operator observes relative registration of the membrane probe contact pads 34 with the die pads 36, the table 59 (FIG. 1) and wafer 12 thereon are moved to precisely align the membrane probe test head contact pads 34 with the die pads 36 of each wafer chip 14. The table then may be slightly raised an additional amount to a point where the contact pads 34 are barely or almost contacting the die pads 36, and gas pressure then is applied to the test fixture gas chamber 80 (FIG. 6). The applied gas pressure on the thin flexible polyimide film 22 stretched across each elongated port 18 forces the membrane probe contact pads 34 into contact with the wafer die pads 36 (FIG. 4), providing a high contact pressure and excellent registration consistency because of the taut span of the membrane in the transverse direction, i.e., across the narrow dimension of the port, while the flexibility of the membrane that carries the contact pads 34 provides a self planarization of the contact pads to ensure good firm electrical contact between each membrane probe contact pad 34 and its associated wafer die pad 36.

A typical wafer may contain dozens or hundreds of dies and therefore dozens or hundreds of groups of electrical contact pads for each of these die. Each membrane probe test head 10 contains sufficient groups of contact pads 34 so that one group of alternate columns of chips on the wafer under test may be tested at a given time with a single touch down of the membrane test probe on the processing wafer. As a most desirable alternative, all of the die of a particular group may be tested simultaneously. Alternatively, sub-groups of die within each group may be tested simultaneously, with sequential testing of the sub-groups by electronic switching while the single touch down for the membrane probe test head is continued. These sub-groups may include all of the die of one or more selected columns or rows of the dies on a processing wafer, for example. Still alternatively, individual die may be tested sequentially, with electronic switching being effected to test the die still while the one touch down for the particular membrane probe test head is continued. Even when the die are tested individually and in sequence, this electronic switching is effected much faster than the physical switching effected using conventional test cards by effecting a step-and-repeat motion with multiple touch downs.

After completing a test on one group of dies, (e.g., all dies in one group of alternate columns of dies), the gas pressure is released from the pressure chamber 80 and the second test head of a membrane probe pair is similarly installed in the test fixture insert. Alternatively, the processing wafer is simply moved to another test station where the complementary membrane test probe is already installed. Then the test of the remaining die groups (alternate die columns) is accomplished.

The test procedure itself, after the appropriate contact is made between the test fixture and the wafer to be tested, can be carried out in an exceedingly short time because all dies of a plurality of columns of dies (e.g., substantially half of the total number of dies on the wafer) can be tested either simultaneously or one column of die at a time, or one die at a time in rapid succession, for example, using only one touchdown of a multi-port membrane probe test head. Therefore, the ability to test many dies with only a single membrane probe positioning effort is a major time saver.

It will be readily understood that two test fixtures may be employed for rapid parallel operation, wherein test fixture insert 54 containing test head 10 for odd-column testing is installed in one such test fixture, while a test fixture insert 54 containing test head 110 for even-column testing is installed in the other such test fixture. Accordingly, the wafer under test is positioned below the first test fixture housing and tested as described above, then is moved to the second test fixture to complete the testing of the remaining columns of chips. In this way, only one test head of each membrane probe pair need be stored and handled for each test fixture, greatly decreasing the positioning and registration time and significantly facilitating visual registration so as to greatly increase the rate of testing.

The test membrane probe and fixture with on-board active test circuitry units and the method of testing described herein have a great many advantages. These advantages include the capability of testing a full wafer having 10,000 to 30,000 contacts, including burn-in testing, in just two touchdowns, one for each membrane probe test head of a membrane probe pair, a capability that was not available heretofore because of the inability to simultaneously (or in rapid sequence with a single touch down) connect to widely separated dies and die pads on the processing wafer. The ability to successfully contact such die pads is achieved through the employment of a multiplicity of elongated ports on a membrane probe test head which overcomes the membrane sag problem while retaining the soft pad contact and causing less damage to die pads than needle or blade contacts of prior conventional probe cards. Additionally, utilizing of the retaining plate mounting fixture of this invention provides the considerable advantage of permitting active test circuitry units to be placed on the rib portions of the substrate that surround the ports, in positions very close to the membrane probe test contact pads, minimizing propagation delays and power loss. Moreover, the ability of the present invention to use MUX/DEMUX circuitry in either address or time division mode permits the testing of thousands of die pad contacts through a much smaller number of I/O connection pins on a test fixture housing.

The temperature coefficient of expansion of the substrate can be matched to the temperature coefficient of expansion of a wafer under test so that testing over an extended range of temperatures is possible. Without such matching of temperature coefficients of expansion, a different expansion of the test membrane probe substrate and the wafer would cause serious misalignment or require use of different membrane probes at different temperatures. The photoform substrate material closely matches the temperature coefficient of expansion of silicon.

Manufacture of the membrane probes described herein is much faster, more efficient, and less expensive than conventional test probes since once the appropriate dies and masks for the photolithographic techniques employed have been manufactured it is relatively simple to manufacture a large number of membrane probes. This is to be distinguished from those probes employing needles and blades which must be individually adjusted on each probe. More importantly, the multi-port feature of the present invention minimizes excessive drape or sag of the membrane, and the soft contact between the contact pads of the membrane probe and the die pads causes considerably decreased wear on the membrane probe contacts which require only routine cleaning and need not be frequently adjusted and readjusted.

With the described membrane probe, alignment accuracy of 1 to 2 microns is possible with a high accuracy testing station that enables precision X,Y motion of the wafer under test. Having such high accuracy alignment, it is feasible to make and employ probe pads of less than 1 mil (0.001 inch) in diameter.

What is claimed is:

1. A multi-port membrane probe test head for testing, with a single touch-down of contact with a processing wafer of semiconductor material, all of the circuit dies in a group of plural circuit dies which are carried on the processing wafer; said membrane probe test head comprising:

a rigid substrate defining multiple through ports each overlying and circumscribing one or more of the plural circuit dies in a group of circuit dies on a processing wafer of semiconductor material;

a flexible transparent membrane spanning each of said through ports at one side of said substrate;

a plurality of test probe contact pads arranged on said membrane on a side thereof opposite to said substrate and within the area of each through port in patterns congruent with respective electrical contact pads of the circuit dies in the group of plural circuit dies;

an active test circuitry unit carried upon said substrate, said active test circuitry unit being selected from the group comprised of: microprocessors, memory chips, voltage regulators, line signal drivers, line signal receivers, equivalents thereto, and combinations thereof;

a plurality of peripherally-arrayed connector pads carried upon said substrate on a side thereof opposite to said membrane;

first conductive means for connecting selected ones of said connector pads to said active circuit test unit; and second conductive means for connecting said active test circuitry unit to selected ones of said plurality of test probe contact pads.

2. The test head of claim 1 wherein the group of circuit dies is arranged to include alternate rows or columns of circuit dies on the processing wafer, said plural ports each being elongated and mutually parallel with one another to define rib portions of said substrate between adjacent ones of said plural ports, said test head further including plural elongate traces extending lengthwise along said rib portions, said elongate traces defining a part of said first conductive means or said second conductive means.

3. The test head of claim 2 wherein said active test circuitry unit is electrically connected to said first conductive means and said second conductive means by an interconnect structure selected from the group including: wire bond, flip-chip, and TAB mounting.

4. The test head of claim 1, and a test head fixture comprising a fixture body defining a through aperture within which said test head is sealingly receivable; a transparent window member sealingly carried by said fixture body and cooperating therewith and with said test head to define a gas-pressure chamber, means for controllably introducing pressurized gas into said gas-pressure chamber to deflect said membrane toward the processing wafer and circuit dies thereon at said multiple through ports, and conductive fixture connecting means for electrically connecting said plurality of connector pads of said test head individually to external test and test-evaluation circuitry.

5. The test head and test head fixture of claim 4 wherein said conductive fixture connecting means includes an annular printed circuit board having contacts corresponding to said connector pads of said test head.

6. The test head and test head fixture of claim 5 wherein said test head fixture includes plural electrical contact pins extending therefrom, and said conductive fixture connecting means includes said printed circuit board conductive structure connecting said plurality of connector pads individually to respective ones of said plural contact pins.

7. A probe for testing a grouping of integrated circuit chips formed adjacent to one another on a semiconductor wafer, each chip having a longitudinal dimension and a transverse dimension, said probe comprising:

a substantially rigid substrate having at least one active test circuitry unit mounted on board said substrate, said at least one active test circuitry unit being selected from the group comprised of: microprocessors, memory chips, multiplexers, de-multiplexers, voltage regulators, line signal drivers, line signal receivers, equivalents thereto, and combinations thereof;

at least one elongated port formed through said substrate, said port having a width not greater than one and one half times said transverse dimension and a length not less than an integral number of said longitudinal dimensions;

a flexible transparent membrane, at least a segment of which extends across said elongated port;

a plurality of electrically conductive traces formed on said membrane, selected ones of said traces being in electrical communication with said on-board active test circuit unit; and a plurality of contact pads formed on selected ones of said traces, said contact pads disposed within said membrane segment.

8. The probe of claim 7 wherein said grouping of chips includes at least two alternate columns of said chips transversely spaced by an alternate column distance and wherein said substrate further includes first and second elongated ports mutually spaced and corresponding to said alternate columns of chips, said second port also having a segment of said flexible membrane extending across said second port, said ports of each said substrate being separated by a rib region of said substrate having at least one rib, each said rib having a width less than said alternate column distance, said probe further comprising:

a second plurality of electrically conductive traces formed on said membrane segment of said second port; and a second plurality of contacts formed on said second plurality of traces; and a plurality of input and output electrical leads for transmitting test data between said probe and an external test fixture.

9. The probe of claim 8 wherein said grouping of chips further comprises a first grouping and a second grouping of said chips on said wafer, and wherein said probe further comprises a probe test head set including first and second substrates configured for serially testing both said groups of chips, said probe test head set comprising a first test head for simultaneously contacting all chips in said first grouping and a second test head for simultaneously contacting all chips in said second grouping.

10. The probe of claim 9 further including at least one part of a multiplexer-demultiplexer set disposed between said electrical input and output leads and said conductive traces, and wherein said on-board active test circuitry unit further comprises at least one line driver and at least one line receiver for distributing said test data from said multiplexer-demultiplexer set to said electrically conductive traces.

11. The probe of claim 9 wherein said on-board active test circuitry unit comprises a microprocessor for providing a plurality of test vectors to said conductive traces.

12. The probe of claim 9 wherein said on-board active test circuitry unit comprises at least one integrated memory circuit for storage and retrieval of said test data.

13. The probe of claim 9 further comprising a power distribution grid for providing power to said electrically conductive traces, and wherein said active test circuitry unit comprises at least one power regulator circuit for distributing power from said power distribution grid.

14. The probe of claim 7 wherein said grouping of chips includes at least two alternate rows of said chips transversely spaced by an alternate row distance and wherein said substrate further includes first and second elongated ports mutually spaced and corresponding to said alternate rows of chips, said second port also having a segment of said flexible membrane extending across said second port, said ports of each said substrate being separated by a rib region of said substrate having at least one rib, each said rib having a width less than said alternate row distance, said probe further comprising:

a second plurality of electrically conductive traces formed on said membrane segment of said second port;

a second plurality of contacts formed on said second plurality of traces; and a plurality of input and output electrical leads for transmitting test data between said probe and an external test fixture.

15. A method for testing all integrated circuit chips in a grouping of such chips formed adjacent one another on a semiconductor wafer, each chip having a longitudinal dimension and a transverse dimension, said method comprising:

providing a substantially rigid test probe having at least one active test circuitry unit mounted thereon and at least one elongated port formed therein, said port having a width no greater than one and one half times said transverse dimension, said probe including a membrane having a segment thereof extending across said port, said membrane segment having probe contact pads formed thereon;

selecting said at least one active test circuitry unit from the group comprised of: microprocessors, memory chips, multiplexers, de-multiplexers, voltage regulators, line signal drivers, line signal receivers, equivalents thereto, and combinations thereof;

positioning said probe adjacent said wafer so that said port is congruent with said grouping of chips; and relatively moving said probe and said wafer to cause said probe contact pads to contact all chips in said grouping of chips at the same time.

16. The method of claim 15 further comprising the step of defining first and second groupings of said chips on said wafer; said step of providing a test probe comprising providing a probe test head set configured for serially testing both said groupings on said wafer; and providing as said test head set a first test head for simultaneously contacting all said chips in said first grouping, and a second test head for simultaneously contacting all chips in said second grouping.

17. The method of claim 16 wherein said step of providing said probe test head set comprises:

forming a first substrate having a first plurality of mutually spaced elongated ports formed therein;

securing to said first substrate a flexible membrane having segments extending across said ports and traces and contact pads formed on an outer side of said membrane segments, said ports, membrane traces and contact pads being arranged in a first pattern corresponding to a first set of alternate columns of chips on said wafer;

mounting at least one active test circuitry unit upon said first substrate; and similarly forming a second substrate having at least one active test circuit unit mounted thereon and a second plurality of ports, membrane traces and contact pads arranged in a second pattern corresponding to a second set of alternate columns of chips on said wafer.

18. The method of claim 16 including:

providing a test fixture assembly and a test fixture insert configured to receive sequentially said first test head and said second test head incorporated therein;

incorporating said first test head into said test fixture insert;

installing said test fixture insert into said test fixture assembly;

relatively moving said test fixture assembly and wafer to cause said first test head to contact said first grouping of chips to be tested;

removing said first test head from said test fixture insert; and incorporating said second test head into said test fixture insert.

19. Apparatus for testing integrated circuit chips on a semiconductor wafer having a predetermined arrangement of said chips divided into at least two chip groupings, each said chip having a plurality of die electrical contact pads thereon, said apparatus comprising;

a test fixture housing having test circuitry connection terminals;

a membrane test probe set having at least two probe test heads, each test head having at least one active test circuitry unit mounted thereon and a plurality of ports, said at least one active test circuitry unit being selected from the group comprised of: microprocessors, memory chips, multiplexers, de-multiplexers, voltage regulators, line signal drivers, line signal receivers, equivalents thereto, and combinations thereof; a membrane having a segment thereof stretched across each one of said plurality of ports, each said segment of said membrane supporting a plurality of test pads, said plurality of ports of each test head being configured to test a different one of said groupings of said chips; and a test fixture insert installed in said test fixture housing, said insert being configured to sequentially receive each said probe test head, said insert together with said test head forming a gas pressure chamber for urging said membrane test pads toward said die pads.

20. Apparatus for simultaneous testing of each of two different groupings of alternate columns of integrated circuit chips formed on a semiconductor wafer, said apparatus comprising:

a test fixture housing having test circuitry connector pins;

an annular printed circuit board received within said test fixture and having a plurality of printed circuit board leads arranged radially along the inner circumference thereof and electrically connected to said test circuitry connector pins;

an elastomeric ring having a plurality of connector elements thereon in electrical communication with said printed circuit board leads;

a test probe set having one test head for testing each said grouping of chips on said wafer, each test head being incorporated sequentially into said test fixture insert and including a test head body comprising a substrate having mutually spaced elongated ports formed therein, at least one active test circuitry unit mounted thereon, said at least one active test circuitry unit being selected from the group comprised of: microprocessors, memory chips, multiplexers, de-multiplexers, voltage regulators, line signal drivers, line signal receivers, equivalents thereto, and combinations thereof; and a flexible transparent membrane having portions thereof extending across each said port, and probe contact pads mounted on said membrane portions and electrically connected via selected ones of said active test circuit units to a plurality of probe connector pads disposed radially along the periphery of said substrate;

a test fixture insert installed in said test fixture housing and incorporating sequentially each said test head, said test fixture insert detachably mechanically interconnecting said test head to said test fixture in a test head operational position, said probe connector pads in said operational position of said test head being in firm electrical contact with said connector elements of said elastomeric member.

21. The apparatus of claim 20 wherein said test fixture insert installed in said housing comprises together with said test head a gas chamber in fluid communication with said membrane portions across said test head elongated ports and includes a gas fitting introducing pressurized gas into said chamber to urge said probe contact pads into contact with said wafer integrated circuit chips.

22. A multi-port membrane test probe for testing with a single touch-down of contact between the test probe and a processing wafer of semiconductor material carrying plural circuit dies, all of the circuit dies in a group on the processing wafer; said membrane test probe comprising:

a rigid substrate defining multiple elongate through ports each overlying and circumscribing one or more of the plural circuit dies in the group of circuit dies on the processing wafer;

a flexible transparent membrane spanning each of said through ports at one side of said substrate;

a plurality of test probe contact pads arranged on said membrane on a side thereof opposite to said substrate and within the area of each through port in patterns congruent with respective electrical contact pads of the circuit dies in the group of plural circuit dies;

active test circuitry units carried upon said substrate for locally generating test vector signals, for applying these test vector signals to selected circuit die under test, for receiving a response signal from the circuit die under test, for evaluating the response signals from the circuit die under test, and for storing an evaluation for each circuit die tested, said active test circuitry units being selected from the group comprised of: microprocessors, memory chips, multiplexers, demultiplexers, voltage regulators, line signal drivers, and line signal receivers;

a plurality of peripherally-arrayed connector pads carried upon said substrate on a side thereof opposite to said membrane;

first conductive means for connecting selected ones of said connector pads to said active circuit test unit; and second conductive means for connecting said active test circuitry unit to selected ones of said plurality of test probe contact pads;

whereby, said active test circuitry units of said multi-port membrane test probe together effectively provide a test signal generator and processor on the test probe and immediately adjacent to the circuit die under test to thereby reduce test signal propagation delays and test signal degradations.

23. The test probe of claim 22 wherein said plural elongated ports are each mutually parallel with one another to define rib portions of said substrate between adjacent ones of said plural ports, said test probe further including plural elongate traces extending lengthwise along said rib portions, said elongate traces defining a part of said first conductive means or said second conductive means.

24. The test probe of claim 22 further including a test probe fixture comprising a fixture body defining a through aperture within which said test probe is sealingly receivable; a transparent window member sealingly carried by said fixture body and cooperating therewith and with said test probe to define a gas-pressure chamber, means for controllably introducing pressurized gas into said gas-pressure chamber to deflect said membrane toward the processing wafer and circuit dies thereon at said multiple through ports, and conductive fixture connecting means for electrically connecting said plurality of connector pads of said test probe individually to external circuitry for communicating with said active test circuitry units to command testing of said circuit dies and to receive test results therefrom.

* * * * *